United States Patent [19]

Pang

[11] Patent Number: 5,606,290
[45] Date of Patent: Feb. 25, 1997

[54] PHASE LOCKED LOOP CIRCUIT HAVING LOCK HOLDER

[75] Inventor: Dai S. Pang, Seoul, Rep. of Korea

[73] Assignee: Goldstar Electron Co., Ltd., Cheongju, Rep. of Korea

[21] Appl. No.: 362,314

[22] Filed: Dec. 22, 1994

[30] Foreign Application Priority Data

Mar. 31, 1994 [KR] Rep. of Korea ................ 6843-1994

[51] Int. Cl.$^6$ ............................................ H03L 7/095
[52] U.S. Cl. ................ 331/1 A; 331/17; 331/DIG. 2
[58] Field of Search ........................ 331/17, 1 A, 1 R, 331/18, 25, DIG. 2

[56] References Cited

U.S. PATENT DOCUMENTS

| 5,015,971 | 5/1991 | Taylor et al. | 331/16 |
| 5,126,690 | 6/1992 | Bui et al. | 331/1 A |
| 5,256,989 | 10/1993 | Parker et al. | 331/1 A |
| 5,304,953 | 4/1994 | Heim et al. | 331/1 A |

Primary Examiner—Robert Pascal
Assistant Examiner—David H. Vu
Attorney, Agent, or Firm—Fleshner & Kim

[57] ABSTRACT

A phase locked loop circuit comprising a reference counter, a programmable counter, a phase detector and a lock detector. The phase locked circuit further comprises a lock enable unit for controlling a voltage pump under control of the phase detector, a channel selector for selecting a desired channel according to a user's selection, a lock holder for holding a locked state in response to an output signal from the channel selector and a lock signal from the lock detector, a refresh clock generator for generating a refresh clock signal in response to an output signal from the reference counter, a NAND gate for NANDing an output signal from the lock holder and the refresh clock signal from the refresh clock generator and outputting the resultant signal to the lock enable unit, first and second inverters for inverting the output signal from the NAND gate, respectively, a first transistor for passing the reference signal to a ground terminal in response to an output signal from the first inverter, and a second transistor for passing the voltage controlled oscillating signal to the ground terminal in response to an output signal from the second inverter.

13 Claims, 3 Drawing Sheets

PHASE LOCKED LOOP CIRCUIT HAVING LOCK HOLDER

BACKGROUND OF THE INVENTION

1. Field of the Invention

The present invention relates in general to a phase locked loop (referred to hereinafter as PLL) circuit, and more particularly to a PLL circuit having a lock holder.

2. Description of the Prior Art

Referring to FIG. 1, there is shown a block diagram of a conventional PLL circuit. As shown in this drawing, the conventional PLL circuit comprises a reference counter 1 for reducing a frequency of a reference signal Ref at a first desired ratio, a programmable counter 2 for reducing a frequency of a voltage controlled oscillating signal VCO at a second desired ratio, and a phase detector 3 for detecting a phase and a frequency of an output signal from the reference counter 1 and a phase and a frequency of an output signal from the programmable counter 2 and outputting error data to an external low pass filter and a lock signal to a lock detector 4 in accordance with the detected result. The lock detector 4 is adapted to input the lock signal from the phase detector 3 and output the inputted lock signal to an external switch.

The operation of the conventional PLL circuit with the above-mentioned construction will hereinafter be described.

First, the reference counter 1 reduces the frequency of the reference signal Ref at the first desired ratio and applies the resultant signal to one input terminal of the phase detector 3. The programmable counter 2 reduces the frequency of the voltage controlled oscillating signal VCO from an external voltage controlled oscillator at the second desired ratio and applies the resultant signal to the other input terminal of the phase detector 3. Then, the phase detector 3 detects whether the phase and the frequency of the output signal from the reference counter 1 are the same as those of the output signal from the programmable counter 2. Upon detecting that the phase and the frequency of the output signal from the reference counter 1 are not the same as those of the output signal from the programmable counter 2, the phase detector 3 outputs a high or low level pulse to the external low pass filter (not shown). Also in this case, the phase detector 3 outputs no lock signal to the lock detector 4.

In detail, when the phase and the frequency of the output signal from the reference counter 1 are greater than those of the output signal from the programmable counter 2, the phase detector 3 outputs the high level pulse to the external low pass filter and no lock signal to the lock detector 4.

In this case, the low pass filter converts the high level pulse from the phase detector 3 into a direct current (DC) value. Then, the low pass filter increases the DC value to increase the frequency of the voltage controlled oscillating signal VCO of the voltage controlled oscillator.

Thereafter, the above operation is repeatedly performed on the basis of the voltage controlled oscillating signal VCO with the increased frequency and the reference signal Ref.

On the contrary, when the phase and the frequency of the output signal from the reference counter 1 are smaller than those of the output signal from the programmable counter 2, the phase detector 3 outputs the low level pulse to the external low pass filter and no lock signal to the lock detector 4.

In this case, the low pass filter converts the low level pulse from the phase detector 3 into a DC value. Then, the low pass filter reduces the DC value to reduce the frequency of the voltage controlled oscillating signal VCO of the voltage controlled oscillator.

Thereafter, the above operation is repeatedly performed on the basis of the voltage controlled oscillating signal VCO with the reduced frequency and the reference signal Ref.

With the above operation repeatedly performed, the phase and the frequency of the output signal from the reference counter 1 become ultimately the same as those of the output signal from the programmable counter 2.

In this case, the phase detector 3 outputs no pulse to the external low pass filter and the lock signal to the lock detector 4.

The lock detector 4 includes a plurality of flip-flops. Upon inputting the lock signal from the phase detector 3, the lock detector 4 detects whether a variation of the inputted lock signal is present for a predetermined time period from the moment that the lock signal is inputted. If it is detected that the variation of the inputted lock signal is not present for the predetermined time period, the lock detector 4 outputs the lock signal to the external switch (not shown).

However, the above-mentioned conventional PLL circuit performs only a function of indicating a locked state. Also, the conventional PLL circuit releases the locked state upon generation of a noise. Further, the conventional PLL circuit requires much current consumption amount because the phase detector, the low pass filter and the voltage controlled oscillator constituting a PLL are operated to hold the locked state continuously.

SUMMARY OF THE INVENTION

Therefore, the present invention has been made in view of the above problem, and it is an object of the present invention to provide a PLL circuit having a lock holder in which a locked state can stably be held with little current consumption amount.

In accordance with the present invention, the above and other objects can be accomplished by a provision of a phase locked loop circuit comprising reference counting means for reducing a frequency of a reference signal at a first desired ratio; programmable counting means for reducing a frequency of a voltage controlled oscillating signal at a second desired ratio; phase detection means for detecting a phase and a frequency of an output signal from said reference counting means and a phase and a frequency of an output signal from said programmable counting means, and transferring the output signal from said reference counting means and the output signal from said programmable counting means and outputting a lock signal in accordance with the detected result; lock detection means for inputting the lock signal from said phase detection means and outputting the inputted lock signal; lock enable means for generating first and second output signals in response to the output signal from said reference counting means and the output signal from said programmable counting means transferred by said phase detection means; voltage pumping means for outputting a supply voltage to an external low pass filter in response to the first and second output signals from said lock enable means; channel selection means for selecting a desired channel according to a user's selection; lock holding means for holding a locked state in response to an output signal from said channel selection means and the lock signal from said lock detection means; refresh clock generation means for generating a refresh clock signal in response to a different output signal from said reference counting means;

logic means for NANDing an output signal from said lock holding means and the refresh clock signal from said refresh clock generation means and outputting the resultant signal to said lock enable means; first and second inversion means for inverting an output signal from said logic means, respectively; first switching means for passing the reference signal to a ground terminal in response to an output signal from said first inversion means; and second switching means for passing the voltage controlled oscillating signal to the ground terminal in response to an output signal from said second inversion means.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENTS

Figure 1:
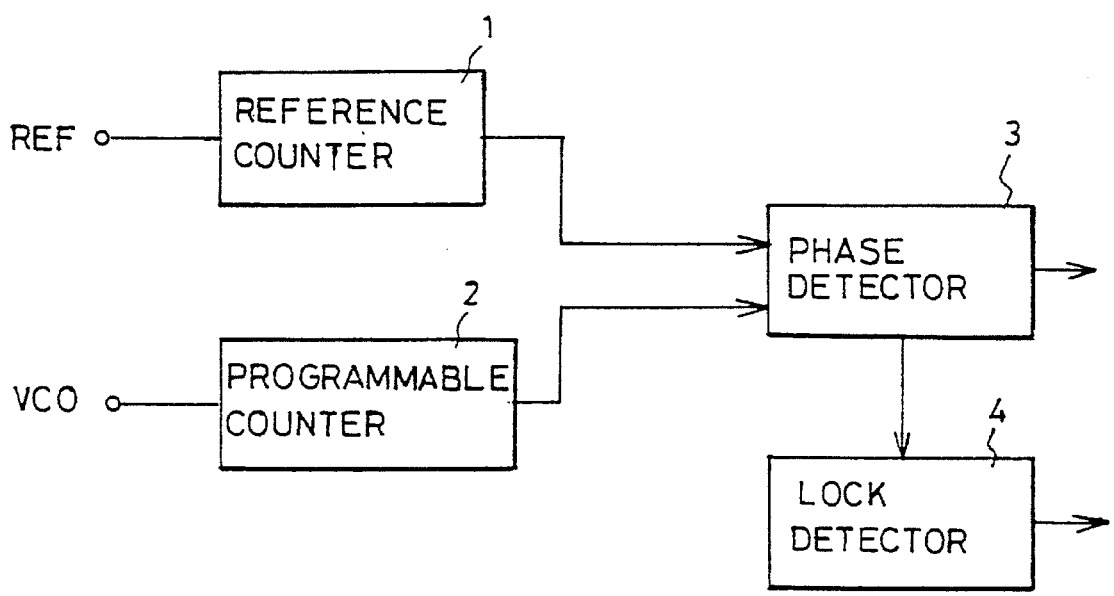
FIG. 1 is a block diagram of a conventional PLL circuit.
Figure 2:
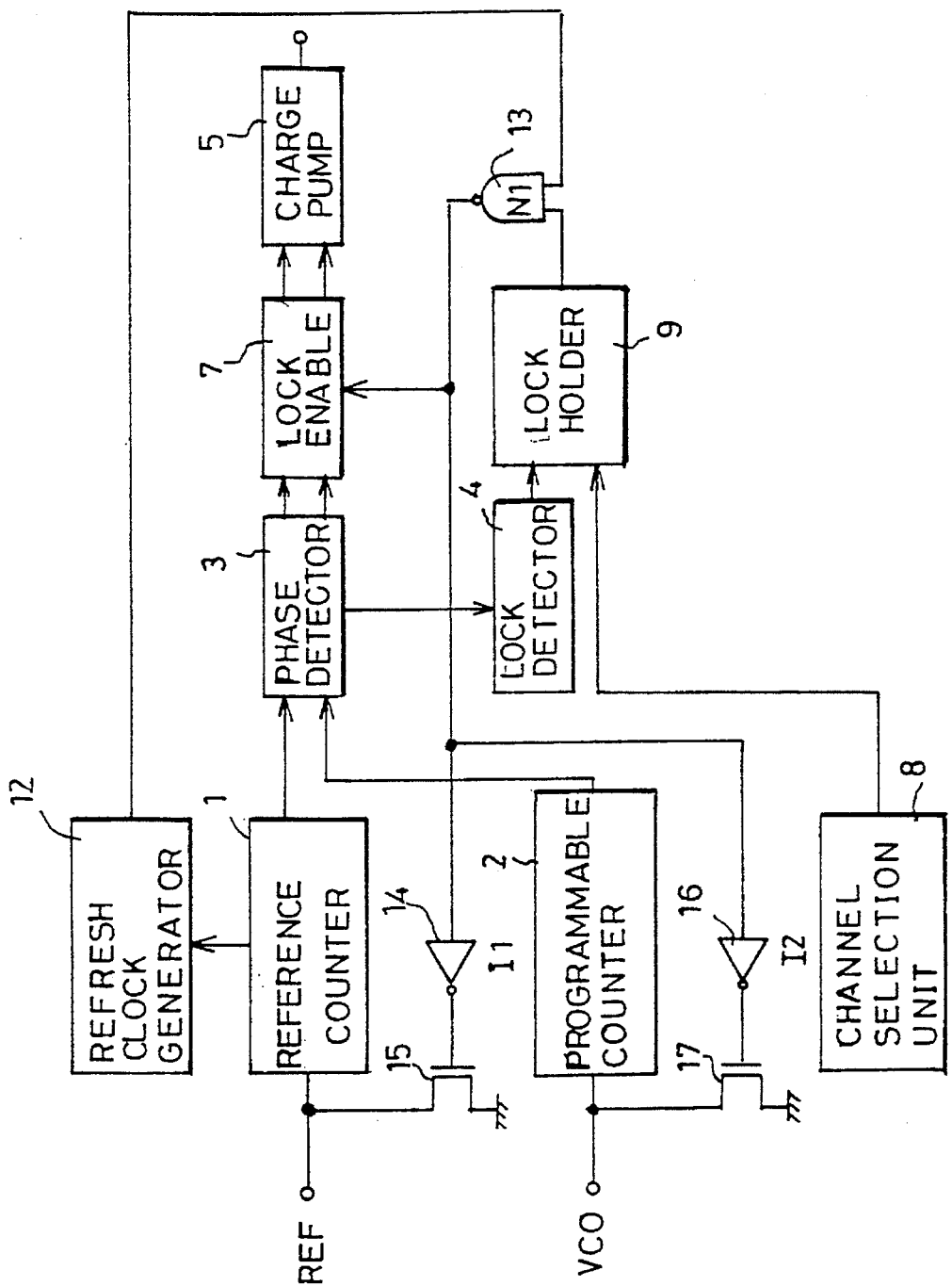
FIG. 2 is a block diagram of a PLL circuit having a lock holder in accordance with the present invention.

Referring to FIG. 2, there is shown a block diagram of a PLL circuit having a lock holder in accordance with the present invention, in which the lock holder is designated by the reference numeral 9. Some of parts in this drawing are the same as those in Fig. 1. Therefore, like reference numerals designate like parts.

As shown in FIG. 2, the PLL circuit comprises the reference counter 1, the programmable counter 2, the phase detector 3 and the lock detector 4. The reference counter 1 is adapted to reduce the frequency of the reference signal Ref at the first desired ratio. The programmable counter 2 is adapted to reduce the frequency of the voltage controlled oscillating signal VCO at the second desired ratio. The phase detector 3 is adapted to detect the phase and the frequency of the output signal from the reference counter 1 and the phase and the frequency of the output signal from the programmable counter 2. In accordance with the detected result, the phase detector 3 transfers the output signal from the reference counter 1 and the output signal from the programmable counter 2 to a lock enable unit 7 and outputs the lock signal to the lock detector 4. The lock detector 4 is adapted to input the lock signal from the phase detector 3 and output the inputted lock signal to the lock holder 9.

The lock enable unit 7 is adapted to control a voltage pump 5 in response to the output signal from the reference counter 1 and the output signal from the programmable counter 2 transferred by the phase detector 3 and an output signal from a NAND gate 13. The voltage pump 5 is adapted to output a supply voltage Vcc to the external low pass filter in response to first and second output signals from the lock enable unit 7.

The PLL circuit also comprises a channel selector 8 for selecting a desired channel according to a user's selection and a refresh clock generator 12 for generating a refresh clock signal in response to a different output signal from the reference counter 1. The lock holder 9 is adapted to hold a locked state in response to an output signal from the channel selector 8 and the lock signal from the lock detector 4. The NAND gate 13 is adapted to NAND an output signal from the lock holder 9 and the refresh clock signal from the refresh clock generator 12 and output the resultant signal to the lock enable unit 7.

Further, the PLL circuit comprises inverters 14 and 16 for inverting the output signal from the NAND gate 13, respectively, an NMOS transistor 15 for passing the reference signal Ref to a ground terminal in response to an output signal from the inverter 14, and an NMOS transistor 17 for passing the voltage controlled oscillating signal VCO to the ground terminal in response to an output signal from the inverter 16.

The above-mentioned construction of the PLL circuit in accordance with the present invention will hereinafter be described in more detail with reference to FIG. 3.

Figure 3:
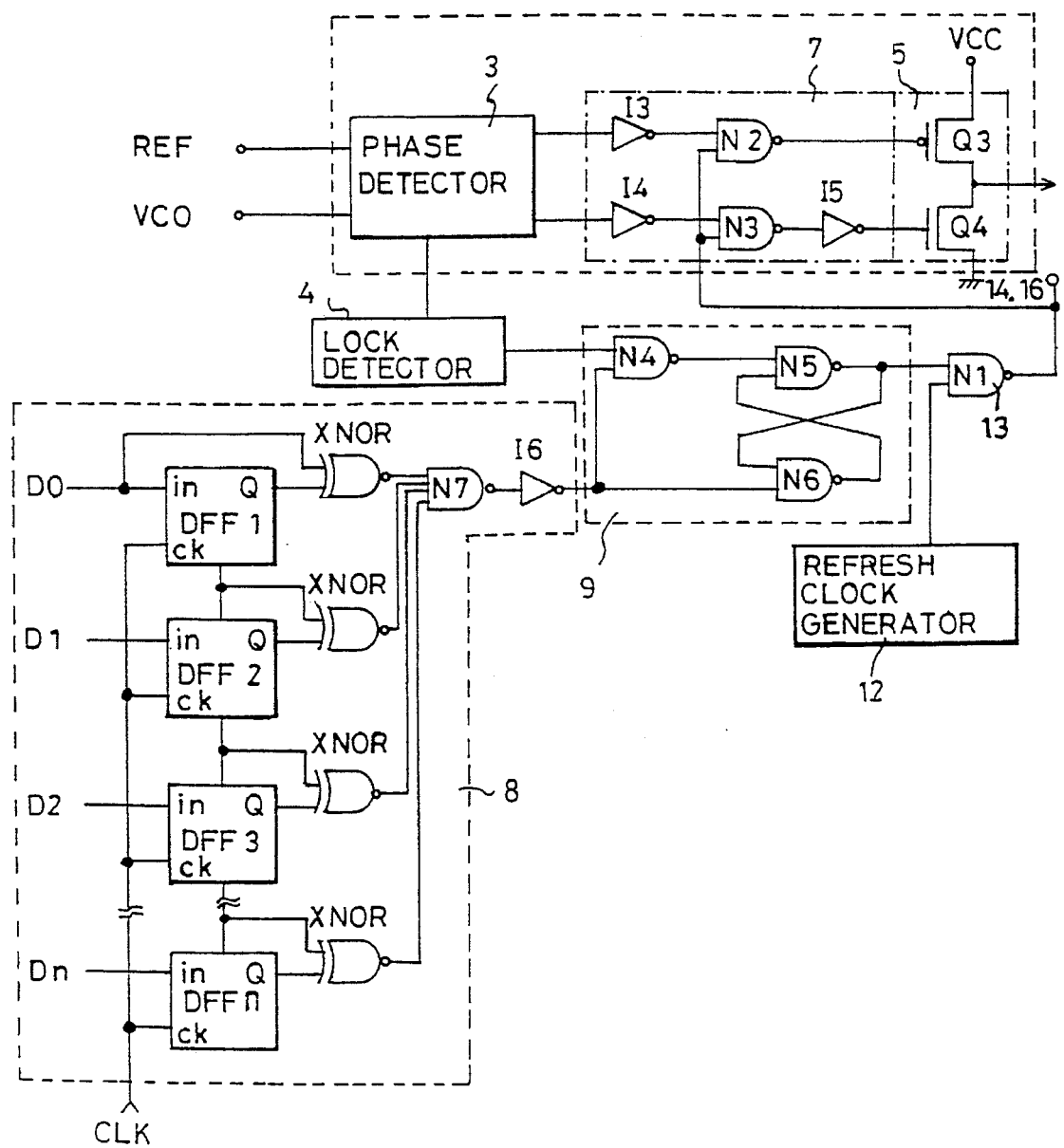
FIG. 3 is a detailed circuit diagram of the PLL circuit in FIG. 2.

As shown in FIG. 3, the lock enable unit 7 includes an inverter I3 for inverting the output signal from the reference counter 1 transferred by the phase detector 3, an inverter I4 for inverting the output signal from the programmable counter 2 transferred by the phase detector 3, a NAND gate N2 for NANDing an output signal from the inverter I3 and the output signal from the NAND gate 13 and applying the resultant signal as the first output signal to the voltage pump 5, a NAND gate N3 for NANDing an output signal from the inverter I4 and the output signal from the NAND gate 13, and an inverter I5 for inverting an output signal from the NAND gate N3 and applying the resultant signal as the second output signal to the voltage pump 5.

The voltage pump 5 includes PMOS and NMOS transistors Q3 and Q4 connected in series between the supply voltage Vcc and a ground voltage. The PMOS transistor Q3 has a gate for inputting the first output signal from the lock enable unit 7 and the NMOS transistor Q4 has a gate for inputting the second output signal from the lock enable unit 7.

The channel selector 8 includes n D flip-flops DFF1–DFFn connected in parallel or series. Each of the n D flip-flops DFF1–DFFn has an input terminal in for inputting a corresponding bit of input data D0–Dn, a clock terminal ck for inputting a common clock signal clk and an output terminal Q. The channel selector 8 also includes n exclusive NOR gates XNOR1–XNORn, each of which inputs a corresponding bit of the input data D0–Dn at its one input terminal and an output signal from a corresponding one of the output terminals Q of the n D flip-flops DFF1–DFFn at its other input terminal. Further, the channel selector 8 includes a NAND gate N7 for NANDing output signals from the n exclusive NOR gates XNOR1–XNORn and an inverter I6 for inverting an output signal from the NAND gate N7 and outputting the resultant signal to the lock holder 9.

The lock holder 9 includes a NAND gate N4 for NANDing the output signal from the channel selector 8 and the lock signal from the lock detector 4 and latched NAND gates N5 and N6. The NAND gate N5 inputs an output signal from the NAND gate N4 and an output signal from the NAND gate N6. The NAND gate N6 inputs the output signal from the channel selector 8 and an output signal from the NAND gate N5. The output signal from the NAND gate N5 is applied to one input terminal of the NAND gate 13, the other input terminal of which inputs the refresh clock signal from the refresh clock generator 12.

The operation of the PLL circuit with the above-mentioned construction in accordance with the present invention will hereinafter be described in detail.

First, the reference counter 1 reduces the frequency of the reference signal Ref at the first desired ratio and applies the resultant signal to one input terminal of the phase detector 3.

The programmable counter 2 reduces the frequency of the voltage controlled oscillating signal VCO from the external voltage controlled oscillator at the second desired ratio and applies the resultant signal to the other input terminal of the phase detector 3.

The phase detector 3 detects whether the phase and the frequency of the output signal from the reference counter 1 are the same as those of the output signal from the programmable counter 2. Upon detecting that the phase and the frequency of the output signal from the reference counter 1 are not the same as those of the output signal from the programmable counter 2, the phase detector 3 transfers the output signal from the reference counter 1 and the output signal from the programmable counter 2 to the lock enable unit 7. Also in this case, the phase detector 3 outputs no lock signal to the lock detector 4. Then, in the voltage pump 5, the PMOS and NMOS transistors Q3 and Q4 are complementarily operated in response to the first and second output signals from the lock enable unit 7 to output the supply voltage Vcc or the ground voltage to the external low pass filter.

Then, the low pass filter increases or reduces the output voltage from the voltage pump 5 to reduce or increase the frequency of the voltage controlled oscillating signal VCO of the voltage controlled oscillator.

In this case, in response to no lock signal from the lock detector 4, the lock holder 9 outputs a low level signal to the one input terminal of the NAND gate 13.

The NAND gate 13 outputs a high level signal in response to the low level signal from the lock holder 9. The high level signal from the NAND gate 13 is inverted by the inverters 14 and 16 and then applied to gates of the NMOS transistors 15 and 17, respectively, thereby causing the NMOS transistors 15 and 17 to be turned off. As a result, the reference signal Ref and the voltage controlled oscillating signal VCO are continuously applied to the reference counter 1 and the programmable counter 2, respectively.

Thereafter, the above operation is repeatedly performed on the basis of the voltage controlled oscillating signal VCO with the varied frequency and the reference signal Ref.

With the above operation repeatedly performed, the phase and the frequency of the output signal from the reference counter 1 become ultimately the same as those of the output signal from the programmable counter 2.

In this case, the phase detector 3 outputs no signal to the lock enable unit 7 and the lock signal to the lock detector 4.

Upon inputting the lock signal from the phase detector 3, the lock detector 4 detects whether a variation of the inputted lock signal is present for a predetermined time period from the moment that the lock signal is inputted. If it is detected that the variation of the inputted lock signal is not present for the predetermined time period, the lock detector 4 outputs the lock signal to the lock holder 9.

Subsequently, the lock holder 9 outputs a high level signal to the one input terminal of the NAND gate 13. The NAND gate 13 outputs a low level signal in response to the high level signal from the lock holder 9. The low level signal from the NAND gate 13 is inverted by the inverters 14 and 16 and then applied to the gates of the NMOS transistors 15 and 17, respectively, thereby causing the NMOS transistors 15 and 17 to be turned on. As a result, the reference signal Ref and the voltage controlled oscillating signal VCO are not applied to the reference counter 1 and the programmable counter 2 and flow to the ground terminal.

On the other hand, under the condition that the data input or the output of the channel selector 8 for change of the locked condition are stopped, the output of the lock detector 4 becomes high in level according to the output of the phase detector 3. Thereafter, when the output of the channel selector 8 becomes high in level, the output of the lock holder 9 becomes high in level.

The NAND gate 13 outputs the high level signal to the lock enable unit 7 in response to the low level signal from the lock holder 9 and the refresh clock signal from the refresh clock generator 12. Also, the high level signal from the NAND gate 13 is inverted by the inverters 14 and 16 and then applied to the gates of the NMOS transistors 15 and 17, respectively, thereby causing the NMOS transistors 15 and 17 to be turned off. As a result, the reference signal Ref and the voltage controlled oscillating signal VCO are continuously applied to the reference counter 1 and the programmable counter 2, respectively.

Then, the phase detector 3 detects whether the phase and the frequency of the output signal from the reference counter 1 are the same as those of the output signal from the programmable counter 2. Upon detecting that the phase and the frequency of the output signal from the reference counter 1 are the same as those of the output signal from the programmable counter 2, the phase detector 3 outputs no signal to the lock enable unit 7 and the lock signal to the lock detector 4. As a result, the voltage pump 5 is fixed by the lock enable unit 7. Also, the reference signal Ref and the voltage controlled oscillating signal VCO flow to the ground terminal through the turned-on NMOS transistors 15 and 17, respectively.

Under this condition, although an instantaneous variation in the reference signal Ref or the voltage controlled oscillating signal VCO is generated or a faulty operation of the lock detector 4 is generated due to the instantaneous variation, the lock holder 9 continues to hold the locked state as long as the output of the channel selector 8 is not changed.

In the case where the data input is changed by the user under the above condition, the output of the channel selector 8 becomes low in level, thereby causing the output of the lock detector 4 to become high in level. As a result, the output of the lock holder 9 remains at its high state.

Subsequently, the NAND gate 13 outputs the high level signal to the lock enable unit 7 in response to the high level signal from the lock holder 9, thereby causing the lock enable unit 7 to be turned off. Also, the high level signal from the NAND gate 13 is inverted by the inverters 14 and 16 and then applied to the gates of the NMOS transistors 15 and 17, respectively, thereby causing the NMOS transistors 15 and 17 to be turned off. As a result, a PLL is formed so that the locked state can be held until the phase and the frequency of the output signal from the reference counter 1 become the same as those of the output signal from the programmable counter 2.

By the way, a DC current may be leaked from the external low pass filter while the lock enable unit 7 remains at its lock enable state under the locked state. For this reason, the refresh clock generator 12 inputs the different output signal from the reference counter 1 and outputs the refresh clock signal to the other input terminal of the NAND gate 13. Namely, the refresh clock generator 12 functions to turn off the lock enable unit 7 at a predetermined time interval to prevent the locked state from being released due to the leakage current from the external low pass filter while the lock enable unit 7 remains at its ON state.

As apparent from the above description, according to the present invention, the locked state can be held as long as an external variation is not applied, although a part of the loop such as the reference signal Ref or the voltage controlled oscillating signal VCO is lost under the locked state. Therefore, little current consumption amount is required by the PLL circuit.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A phase locked loop circuit comprising:

reference counting means for reducing a frequency of a reference signal at a first desired ratio;

programmable counting means for reducing a frequency of a voltage controlled oscillating signal at a second desired ratio;

phase detection means for detecting a phase and a frequency of an output signal from said reference counting means and a phase and a frequency of an output signal from said programmable counting means, and transferring the output signal from said reference counting means and the output signal from said programmable counting means and outputting a lock signal in accordance with the detected result;

lock detection means for inputting the lock signal from said phase detection means and outputting the inputted lock signal;

lock enable means for generating first and second output signals in response to the output signal from said reference counting means and the output signal from said programmable counting means transferred by said phase detection means;

voltage pumping means for outputting a supply voltage to an external low pass filter in response to the first and second output signals from said lock enable means;

channel selection means for selecting a desired channel according to a user's selection;

lock holding means for holding a locked state in response to an output signal from said channel selection means and the lock signal from said lock detection means;

refresh clock generation means for generating a refresh clock signal in response to a different output signal from said reference counting means;

logic means for NANDing an output signal from said lock holding means and the refresh clock signal from said refresh clock generation means and outputting the resultant signal to said lock enable means;

first and second inversion means for inverting an output signal from said logic means, respectively;

first switching means for passing the reference signal to a ground terminal in response to an output signal from said first inversion means; and second switching means for passing the voltage controlled oscillating signal to the ground terminal in response to an output signal from said second inversion means.

2. A phase locked loop circuit as set forth in claim 1, wherein said voltage pumping means includes:

PMOS and NMOS transistors connected in series between the supply voltage and a ground voltage, said PMOS transistor having a gate for inputting the first output signal from said lock enable means, said NMOS transistor having a gate for inputting the second output signal from said lock enable means.

3. A phase locked loop circuit as set forth in claim 1, wherein said lock enable means includes:

a first inverter for inverting the output signal from said reference counting means transferred by said phase detection means;

a second inverter for inverting the output signal from said programmable counting means transferred by said phase detection means;

a first NAND gate for NANDing an output signal from said first inverter and the output signal from said logic means and applying the resultant signal as the first output signal to said voltage pumping means;

a second NAND gate for NANDing an output signal from said second inverter and the output signal from said logic means; and a third inverter for inverting an output signal from said second NAND gate and applying the resultant signal as the second output signal to said voltage pumping means.

4. A phase locked loop circuit as set forth in claim 1, wherein said lock holding means includes:

a first NAND gate for NANDing the output signal from said channel selection means and the lock signal from said lock detection means; and latched second and third NAND gates, said second NAND gate NANDing an output signal from said first NAND gate and an output signal from said third NAND gate and outputting the resultant signal to said logic means, said third NAND gate NANDing the output signal from said channel selection means and an output signal from said second NAND gate and outputting the resultant signal to said second NAND gate.

5. A phase locked loop circuit as set forth in claim 1, wherein said channel selection means includes:

a plurality of D flip-flops connected in series;

a plurality of exclusive NOR gates, each of said plurality of exclusive NOR gates inputting a corresponding bit of input data at its one input terminal and an output signal from a corresponding one of said plurality of D flip-flops at its other input terminal;

a NAND gate for NANDing output signals from said plurality of exclusive OR gates; and an inverter for inverting an output signal from said NAND gate and outputting the resultant signal to said lock holding means.

6. A circuit for maintaining a lock between first and second signals inputted, respectively, to a reference counter and a program counter in response to a lock signal generated by a phase detector to a lock detector in a phase locked loop circuit, the circuit comprising:

a lock holder circuit coupled to the lock detector;

a generator coupled to the reference counter such that a clock signal is generated in response to a signal from the reference counter;

a first logic gate coupled to said lock holder and said generator such that a logical operation is performed between output signals from said lock holder and said generator;

at least one switch coupled to at least one of the reference counter and programmable counter such that the first and second signals are not inputted to the reference and programmable counters in response to an output signal from said first logic gate.

7. The circuit of claim 6, further comprising:

a lock enable circuit coupled to the phase detector, said lock enable circuit generating first and second output signals in response to an output signal from the reference counter and an output signal from the programmable counter transferred by the phase detection circuit.

8. The circuit of claim 7, wherein said lock enable circuit comprises second and third logic gates coupled to the phase detector, said second and third logic gates receiving an output signal from said first logic gate.

9. The circuit of claim 7, further comprising a voltage pumping circuit coupled to said lock enable circuit such that said voltage pumping circuit outputs a supply voltage in response to the first and second output signals from said lock enable circuit.

10. The circuit of claim 9, wherein said voltage pumping circuit comprises first and second transistors connected to each other and connected between a supply voltage and a ground voltage, said first transistor having a gate receiving the first output signal from said lock enable circuit, and said second transistor having a gate receiving the second output signal from said lock enable circuit.

11. The circuit of claim 6 further comprising a channel selection circuit coupled to said lock holder circuit such that a user can select a desired channel.

12. The circuit of claim 8, wherein said lock holder circuit comprises:

a second logic gate coupled to the lock detector and said channel selection circuit;

a third logic gate coupled to said channel selection circuit; and a fourth logic gate coupled to said second logic gate, said third and fourth logic gates coupled to each other to receive an output signal from one another, and said fourth logic gate coupled to said first logic gate.

13. The circuit of claim 11, wherein said channel selection circuit comprises:

a plurality of flip-flops connected in series;

a plurality of second logic gates, each second logic gate being coupled to a corresponding one of said plurality of flip-flops and adjacent flip-flop;

a third logic gate coupled to said plurality of second logic gates; and a fourth logic gate coupled to said third logic gate such that an output signal from said third logic gate is inverted.

* * * * *